US008816782B2

(12) United States Patent
Chang (10) Patent No.: US 8,816,782 B2
(45) Date of Patent: Aug. 26, 2014

(54) PHASE LOCKED LOOP CIRCUIT HAVING A VOLTAGE CONTROLLED OSCILLATOR WITH IMPROVED BANDWIDTH

(75) Inventor: Yi Cheng Chang, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/104,449

(22) Filed: May 10, 2011

(65) Prior Publication Data

US 2012/0286887 A1    Nov. 15, 2012

(51) Int. Cl.
*H03K 3/03* (2006.01)
*H03B 5/02* (2006.01)
*H03L 7/00* (2006.01)

(52) U.S. Cl.
CPC .. *H03B 5/02* (2013.01); *H03L 7/00* (2013.01); *H03K 3/0322* (2013.01)
USPC ........................................ 331/57; 331/108 R (58) Field of Classification Search
CPC ........... H03L 7/00; H03K 3/0322; H03B 5/02
USPC ................................................ 331/57, 108 R
See application file for complete search history.

(56) References Cited

U.S. PATENT DOCUMENTS

| 5,239,274 | A | | 8/1993 | Chi |
|---|---|---|---|---|
| 5,420,547 | A | | 5/1995 | Kikuchi |
| 5,952,892 | A | * | 9/1999 | Szajda ............................ 331/57 |
| 5,963,102 | A | * | 10/1999 | Pang ............................... 331/57 |
| 6,385,442 | B1 | * | 5/2002 | Vu et al. ........................ 455/318 |
| 6,414,522 | B1 | * | 7/2002 | Nguyen et al. ................. 327/101 |
| 6,492,848 | B1 | * | 12/2002 | Lee ................................. 327/143 |
| 6,535,070 | B2 | | 3/2003 | Hwang et al. |
| 6,710,667 | B2 | * | 3/2004 | Nagano ............................ 331/57 |
| 6,771,124 | B1 | * | 8/2004 | Ezell .............................. 330/129 |
| 6,937,054 | B2 | * | 8/2005 | Hsu et al. ........................ 326/30 |
| 7,633,351 | B2 | | 12/2009 | Raita et al. |
| 7,701,301 | B2 | | 4/2010 | Lakshmikumar et al. |
| 7,710,207 | B2 | | 5/2010 | Wu |
| 2006/0008042 | A1 | * | 1/2006 | Cranford et al. ............... 375/376 |
| 2007/0201546 | A1 | * | 8/2007 | Lee ................................ 375/229 |
| 2008/0032646 | A1 | * | 2/2008 | Huang et al. ................... 455/131 |
| 2008/0240218 | A1 | * | 10/2008 | Sumesaglam ................. 375/229 |

OTHER PUBLICATIONS

Gu, Z., et al., "Source Capacitively Coupled Compensation Technique and its Applications", IEEE, 2003 Radio Frequency Integrated Circuits (RFIC) Symposium, pp. 623-626.
Tao, R., et al., "The Design of 5 GHz Voltage Controlled Ring Oscillator Using Source Capacitively Coupled Current Amplifier", IEEE, 2004, EDMO, pp. 110-114.

* cited by examiner

*Primary Examiner* — Arnold Kinkead
*Assistant Examiner* — Richard Tan
(74) *Attorney, Agent, or Firm* — Daniel D. Hill (57) ABSTRACT

A voltage controlled oscillator includes a plurality of serially connected composite gain stages. A composite gain stage includes a transconductance stage and a transimpedance stage. The transconductance stage has first and second current paths from a first power supply voltage terminal to a second power supply voltage terminal. A first variable resistance is coupled between the first and second current paths. The transimpedance stage has a first inverter and a second inverter. The first inverter has an input terminal coupled to the output of the first current path and an output terminal. The second inverter has an input terminal coupled to the output of the second current path, and an output terminal. A second variable resistance is coupled between the input terminal and the output terminal of the first inverter, and a third variable resistance is coupled between the input terminal and the output terminal of the second inverter.

20 Claims, 7 Drawing Sheets

FIG. 8 ents that is not clearly visible —

PHASE LOCKED LOOP CIRCUIT HAVING A VOLTAGE CONTROLLED OSCILLATOR WITH IMPROVED BANDWIDTH

BACKGROUND

1. Field

This disclosure relates generally to circuits, and more specifically, to a phase locked loop circuit having a voltage controlled oscillator with improved bandwidth.

2. Related Art

A phase locked loop (PLL) circuit is used to generate a clock signal. The PLL circuit generally includes a voltage controlled oscillator (VCO) to generate the clock signal in response to a control voltage. LC (inductor-capacitor) oscillators are used in some VCO circuits to provide high quality clock sources. However, an integrated circuit having multiple PLL circuits with LC oscillators may experience injection locking problems when mutual coupling occurs between the PLL circuits. The injection locking problems can result in poor jitter performance at the PLL output.

To overcome the injection locking problem, a combination of LC oscillators and ring oscillators may be used to prevent two neighboring LC oscillators from running in the same frequency range. Ring oscillators are then used to fill in any missing gaps in the operational frequencies. However, ring oscillators may suffer from several limitations in high frequency applications, such as for example, microwave frequencies. For example, the available maximum frequency of a ring oscillator is determined by a gain-bandwidth product of its gain stages. In order to operate at higher frequencies, the gain stages of the ring oscillators with sufficiently high speed and high gain are desirable. Therefore, higher transconductance, and in turn higher gain with higher power consumption is usually expected. Also, the VCO tuning range has to be sufficiently wide to cover frequency variations over supply voltage, temperature, and silicon process variations. In addition, the tuning circuits may cause extra parasitic loading that limits the maximum frequency. Further, the VCO conversion gain must be optimized with respect to the VCO frequency tuning range, adding complexity to the PLL design.

Therefore, what is needed is a PLL circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a PLL system having a ring oscillator based VCO. The ring oscillator has a plurality of composite stages. Each of the plurality of composite stages has a transconductance stage for providing a current mode signal and a transimpedance stage for providing a voltage mode signal. An output of the transconductance stage is coupled to an input of the transimpedance stage. The transconductance stages may include a variable resistance for fine tuning control. A fine tune control voltage is provided to the variable resistance to provide the fine frequency adjustment of the ring oscillator. Each of the transimpedance stages includes a variable resistance. A coarse tune control voltage is provided to the variable resistance of the transimpedance stages to provide a coarse frequency adjustment to the ring oscillator. The variable resistance of the transimpedance stage allows the input of the transimpedance stage to have a relatively low impedance. The transconductance stage outputs a current mode signal having a relatively small voltage swing. The transimpedance stages each convert the current mode signal to a voltage mode signal having significant gain.

The ring oscillators of the disclosed embodiments each have a wider tuning range than a ring oscillator that uses a variable capacitor for frequency tuning. Also, the gain of the ring oscillator does not decrease with increasing frequency, as is the case of prior art ring oscillators that use a variable capacitance for frequency tuning. The ring oscillator provides the wider tuning range and higher frequency operation while providing lower power consumption. In addition, for a maximum frequency design, the ring oscillators in accordance with the disclosed embodiments only need two composite gain stages.

In one aspect, there is provided, a voltage controlled oscillator comprising: a plurality of serially connected composite gain stages, a composite gain stage of the plurality of serially connected composite gain stages comprising: a transconductance stage having first and second current paths from a first power supply voltage terminal to a second power supply voltage terminal, each of the first and second current paths having an input terminal and an output terminal, and a first variable resistance coupled between the first and second current paths, the first variable resistance responsive to a first control signal; and a transimpedance stage having a first inverter and a second inverter, the first inverter having an input terminal coupled to the output of the first current path and an output terminal, the second inverter having an input terminal coupled to the output of the second current path, and an output terminal, a second variable resistance coupled between the input terminal and the output terminal of the first inverter, a third variable resistance coupled between the input terminal and the output terminal of the second inverter, the second and third variable resistances responsive to a second control signal. The transconductance stage may further comprise: a first transistor having a first current electrode coupled to the first power supply voltage terminal, a control electrode for receiving a bias voltage, and a second current electrode coupled to a first output terminal; a second transistor having a first current electrode coupled to the second current electrode of the first transistor, a control electrode coupled to a first input terminal for receiving a first input signal, and a second current electrode; a first current source having a first terminal coupled to the second current electrode of the second transistor, and a second terminal coupled to the second power supply voltage terminal; a third transistor having a first current electrode coupled to the first power supply voltage terminal, a control electrode for receiving the bias voltage, and a second current electrode coupled to a second output terminal; a fourth transistor having a first current electrode coupled to the second current electrode of the third transistor, a control electrode coupled to a second input terminal for receiving a second input signal, and a second current electrode; and a second current source having a first terminal coupled to the second current electrode of the fourth transistor, and a second terminal coupled to the second power supply voltage terminal. The transconductance stage may further comprise: a capacitor having a first plate electrode coupled to the second current electrode of the second transistor, and a second plate electrode coupled to the second current electrode of the fourth transistor; and the first variable resistance having a first terminal coupled to the second current electrode of the second transistor, a second terminal coupled to the second current electrode of the fourth transistor, and a control terminal for receiving the first control signal. The transconductance stage may further comprise: the first variable resistance having a first terminal coupled to the second current electrode of the second transistor, and a second terminal; a capacitor having a first plate electrode coupled to the second terminal of the first variable resistance, and a second plate electrode; and a fourth variable resistance having a first terminal coupled to the second plate electrode of the capacitor, and a second terminal coupled to the second current electrode of the fourth transistor. The voltage controlled oscillator may further comprise: a fifth transistor having a first current electrode coupled to the second current electrode of the first transistor, a control electrode coupled to the second input terminal, and a second current electrode; a third current source having a first terminal coupled to the second current electrode of the fifth transistor, and a second terminal coupled to the second power supply voltage terminal; a sixth transistor having a first current electrode coupled to the second current electrode of the third transistor, a control electrode coupled to the first input terminal, and a second current electrode; and a fourth current source having a first terminal coupled to the second current electrode of the sixth transistor, and a second terminal coupled to the second power supply voltage terminal. The voltage controlled oscillator may further comprise: the first variable resistance having a first terminal coupled to the second current electrode of the second transistor, and a second terminal; a first capacitor having a first plate electrode coupled to the second terminal of the first variable resistance, and a second plate electrode; a fourth variable resistance having a first terminal coupled to the second plate electrode of the first capacitor, a second terminal coupled to the second current electrode of the fourth transistor, and a control electrode for receiving the first control signal; and a resistive element having a first terminal coupled to the second current electrode of the second transistor, and a second terminal coupled to the second current electrode of the fourth transistor. The voltage controlled oscillator may further comprise: a second capacitor having a first plate electrode coupled to the second current electrode of the fifth transistor, and a second plate electrode coupled to the second current electrode of the sixth transistor; and a fifth variable resistance having a first terminal coupled to the second current electrode of the fifth transistor, a second terminal coupled to the second current electrode of the sixth transistor, and a control electrode for receiving a third control signal. The transimpedance stage may further comprise a current source coupled between the first and second inverters and the second power supply voltage terminal. The plurality of serially connected composite gain stages may comprise an even number of serially connected composite gain stages. The voltage controlled oscillator may further comprise a start-up circuit comprising: a first transistor having a first current electrode coupled to the first power supply voltage terminal, a control electrode, and a second current electrode; a second transistor having a first current electrode coupled to the control electrode of the first transistor, a control electrode coupled to the first power supply voltage terminal, and a second current electrode coupled to the second power supply voltage terminal; a capacitor having a first plate electrode coupled to the second current electrode of the first transistor, and a second plate electrode coupled to the second power supply voltage terminal; a Schmitt trigger having an input terminal coupled to the second current electrode of the first transistor, and an output terminal; and a plurality of start-up switches coupled to the output terminal of the Schmitt trigger and to selected input terminals and output terminals of the plurality of serially connected composite gain stages.

In another aspect, there is provided, a voltage controlled oscillator comprising: a plurality of serially connected composite gain stages, a composite gain stage of the plurality of serially connected composite gain stages comprising: a transconductance stage comprising: a first transistor having a first current electrode coupled to the first power supply voltage terminal, a control electrode for receiving a bias voltage, and a second current electrode coupled to a first output terminal; a second transistor having a first current electrode coupled to the second current electrode of the first transistor, a control electrode coupled to a first input terminal for receiving a first input signal, and a second current electrode; a first current source having a first terminal coupled to the second current electrode of the second transistor, and a second terminal coupled to the second power supply voltage terminal; a third transistor having a first current electrode coupled to the first power supply voltage terminal, a control electrode for receiving the bias voltage, and a second current electrode coupled to a second output terminal; a fourth transistor having a first current electrode coupled to the second current electrode of the third transistor, a control electrode coupled to a second input terminal for receiving a second input signal, and a second current electrode; a second current source having a first terminal coupled to the second current electrode of the fourth transistor, and a second terminal coupled to the second power supply voltage terminal; and a first variable resistance having a first terminal coupled to the second current electrode of the second transistor, a second terminal coupled to the second current electrode of the fourth transistor, and a control terminal for receiving a first control signal; and a transimpedance stage having a first inverter and a second inverter, the first inverter having an input terminal coupled to the first output terminal of the transconductance stage, the second inverter having an input terminal coupled to the second output terminal of the transconductance stage, and an output terminal, a second variable resistance coupled between the input terminal and the output terminal of the first inverter, a third variable resistance coupled between the input terminal and the output terminal of the second inverter, the second and third variable resistances responsive to a second control signal. The transconductance stage may further comprise a capacitor having a first plate electrode coupled to the second current electrode of the second transistor, and a second plate electrode coupled to the second current electrode of the fourth transistor. The transconductance stage may further comprise:

the first variable resistance having a first terminal connected to the second current electrode of the second transistor, and a second terminal; a capacitor having a first plate electrode connected to the second terminal of the first variable resistance, and a second plate electrode; and a fourth variable resistance having a first terminal connected to the second plate electrode of the capacitor, and a second terminal connected to the second current electrode of the fourth transistor. The voltage controlled oscillator may further comprise: a fifth transistor having a first current electrode coupled to the second current electrode of the first transistor, a control electrode coupled to the second input terminal, and a second current electrode; a third current source having a first terminal coupled to the second current electrode of the fifth transistor, and a second terminal coupled to the second power supply voltage terminal; a sixth transistor having a first current electrode coupled to the second current electrode of the third transistor, a control electrode coupled to the first input terminal, and a second current electrode; and a fourth current source having a first terminal coupled to the second current electrode of the sixth transistor, and a second terminal coupled to the second power supply voltage terminal. The transimpedance stage may further comprise a current source coupled between the first and second inverters and the second power supply voltage terminal. The plurality of serially connected composite gain stages may comprise an even number of serially connected composite gain stages. The voltage controlled oscillator may further comprise a start-up circuit comprising: a fifth transistor having a first current electrode coupled to the first power supply voltage terminal, a control electrode, and a second current electrode; a sixth transistor having a first current electrode coupled to the control electrode of the first transistor, a control electrode coupled to the first power supply voltage terminal, and a second current electrode coupled to the second power supply voltage terminal; a capacitor having a first plate electrode coupled to the second current electrode of the fifth transistor, and a second plate electrode coupled to the second power supply voltage terminal; a Schmitt trigger having an input terminal coupled to the second current electrode of the fifth transistor, and an output terminal; and a plurality of start-up switches coupled to the output terminal of the Schmitt trigger and to selected input terminals and output terminals of the plurality of serially connected composite gain stages.

In yet another aspect, there is provided, a voltage controlled oscillator comprising: a plurality of serially connected composite gain stages, a composite gain stage of the plurality of serially connected composite gain stages comprising: a transconductance stage comprising: a first transistor having a first current electrode coupled to the first power supply voltage terminal, a control electrode for receiving a bias voltage, and a second current electrode coupled to a first output terminal; a second transistor having a first current electrode coupled to the second current electrode of the first transistor, a control electrode coupled to a first input terminal for receiving a first input signal, and a second current electrode; a first current source having a first terminal coupled to the second current electrode of the second transistor, and a second terminal coupled to the second power supply voltage terminal; a third transistor having a first current electrode coupled to the first power supply voltage terminal, a control electrode for receiving the bias voltage, and a second current electrode coupled to a second output terminal; a fourth transistor having a first current electrode coupled to the second current electrode of the third transistor, a control electrode coupled to a second input terminal for receiving a second input signal, and a second current electrode; a second current source having a first terminal coupled to the second current electrode of the fourth transistor, and a second terminal coupled to the second power supply voltage terminal; and a first variable resistance having a first terminal coupled to the second current electrode of the second transistor, a second terminal coupled to the second current electrode of the fourth transistor, and a control terminal for receiving a first control signal; and a transimpedance stage comprising: a fifth transistor having a first current electrode coupled to the first power supply voltage terminal, a control electrode coupled to the first output terminal of the transconductance stage, and a second current electrode; a sixth transistor having a first current electrode coupled to the second current electrode of the fifth transistor, a control electrode coupled to the first output terminal of the transconductance stage, and a second current electrode; a second variable resistance having a first terminal coupled to the control electrodes of the fifth and sixth transistors, a second terminal coupled to the second current electrode of the fifth transistor, and a control electrode for receiving a second control signal; a seventh transistor having a first current electrode coupled to the first power supply voltage terminal, a control electrode coupled to the second output terminal of the transconductance stage, and a second current electrode; an eighth transistor having a first current electrode coupled to the second current electrode of the seventh transistor, a control electrode coupled to the second output terminal of the transconductance stage, and a second current electrode; a third variable resistance having a first terminal coupled to the control electrodes of the seventh and eighth transistors, a second terminal coupled to the second current electrode of the seventh transistor, and a control electrode for receiving the second control signal; and a third current source having a first terminal coupled to the second current electrodes of the sixth and eighth transistors, and a second terminal coupled to the second power supply voltage terminal. The transconductance stage may further comprise a capacitor having a first plate electrode coupled to the second current electrode of the second transistor, and a second plate electrode coupled to the second current electrode of the fourth transistor. The transconductance stage may further comprise: the first variable resistance having a first terminal connected to the second current electrode of the second transistor, and a second terminal; a capacitor having a first plate electrode connected to the second terminal of the first variable resistance, and a second plate electrode; and a fourth variable resistance having a first terminal connected to the second plate electrode of the capacitor, and a second terminal connected to the second current electrode of the fourth transistor.

A semiconductor substrate for implementing the presently disclosed embodiments can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one.

Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
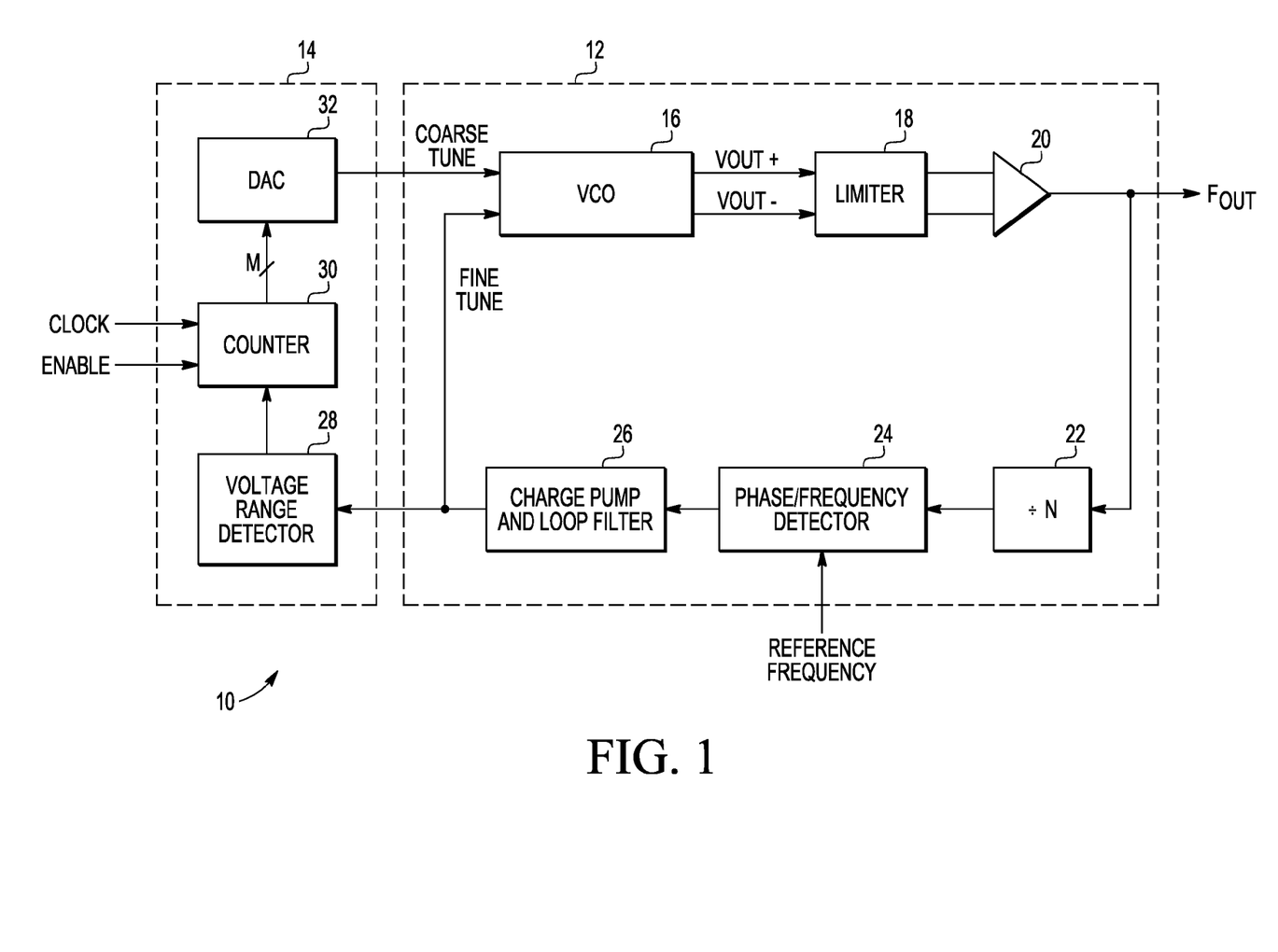
FIG. 1 illustrates, in block diagram form, a PLL system in accordance with an embodiment.

FIG. 1 illustrates, in block diagram form, PLL system 10 in accordance with an embodiment. PLL system 10 includes PLL circuit 12 and VCO frequency calibration circuit 14. PLL circuit 12 includes VCO 16, limiter 18, buffer 20, divider 22, phase/frequency detector 24, and charge pump and loop filter 26. VCO frequency calibration circuit 14 includes voltage range detector 28, counter 30, and digital-to-analog converter (DAC) 32.

PLL system 10 uses a coarse tuning frequency control and fine tuning frequency control scheme. During start up operation of PLL circuit 12, VCO frequency calibration circuit 14 provides a coarse tuning voltage labeled "COARSE TUNE" to an input of VCO 16. The coarse tuning frequency control is only performed when system power is turned on. Process, voltage, and temperature variation calibration occurs during the power on coarse tuning calibration. Phase/frequency detector 24 receives an input signal labeled "REFERENCE FREQUENCY" and a feedback signal from divider 22. After startup, and during normal operation, phase/frequency detector 24 operates as a conventional phase/frequency detector. Phase/frequency detector determines whether the output signal VOUT leads or lags reference signal REFERENCE FREQUENCY, and provides up and down control signals to control the operation of charge pump and loop filter 26. Charge pump and loop filter 26 provides a control voltage labeled "FINE TUNE" to adjust the frequency of VCO 16. Limiter 18 functions to amplify differential output signals from VCO 16 labeled "VOUT+" and "VOUT−". Buffer 20 provides an output signal FOUT with sufficient drive strength.

Frequency calibration circuit 14 is coupled to receive control voltage FINE TUNE. After a predetermined system settling time, the initial fine tune voltage generated by the feedback loop is verified by voltage range detector 28 to detect if the PLL operating frequency is in the desired range. If the frequency is not within the range, as determined by voltage range detector 28, a predetermined M-bit counter value is converted to an analog voltage by DAC 32 and provided as a coarse tune voltage COARSE TUNE to VCO 16. The new COARSE TUNE voltage corrects the frequency range of VCO 16. The operation of VCO 16 will be described below in more detail.

Figure 2:
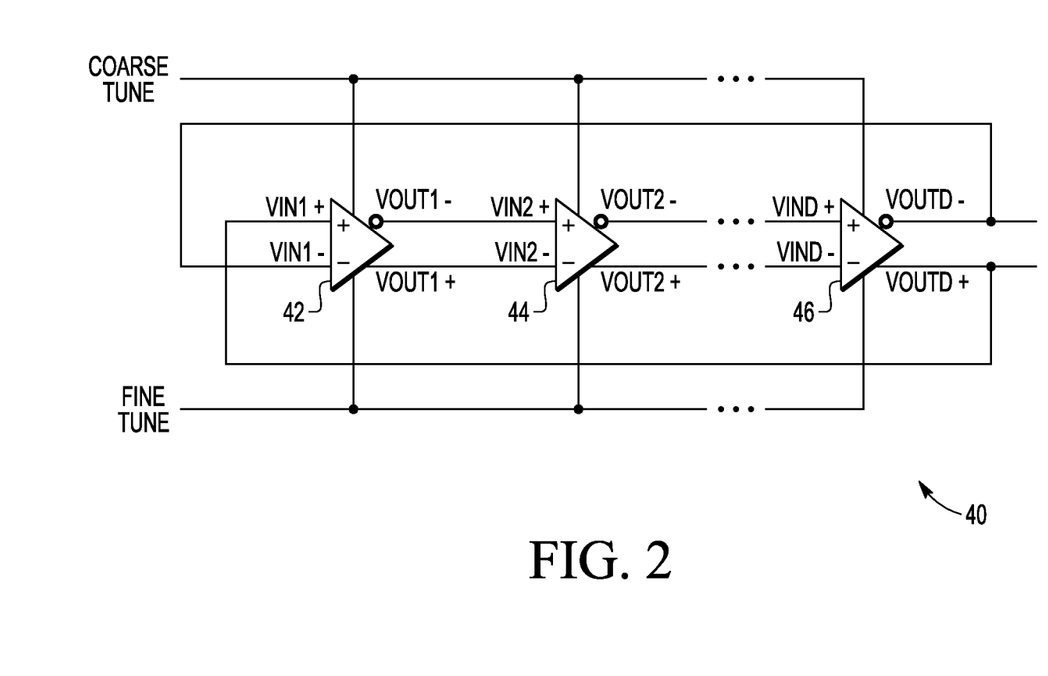
FIG. 2 illustrates, in logic diagram form, a ring oscillator of the VCO of the PLL system of FIG. 1.

FIG. 2 illustrates, in logic diagram form, ring oscillator 40 of VCO 16 of FIG. 1. Ring oscillator 40 includes a plurality of composite gain stages represented by composite gain stages 42, 44, and 46. Each composite gain stage includes differential input terminals, differential output terminals, a control terminal for receiving control signal COARSE TUNE, and a control terminal for receiving control signal FINE TUNE. Composite gain stage 42 has a first input for receiving input signal VIN1+, a second input for receiving input signal VIN1−, an inverting output for providing output signal VOUT1−, a non-inverting output for providing output signal VOUT1+. With respect to composite gain stage 44, output signal VOUT1+ and VOUT1− become input signals VIN2+ and VIN2−. Composite gain stage 44 has an inverting output for providing output signal VOUT2− and a non-inverting output for providing VOUT2+. Composite gain stage 46 is the last gain stage in ring oscillator 40 and has inputs VIND+ and VIND−, and outputs VOUTD+ and VOUTD−, where D is the number of composite gain stages. Generally, ring oscillator 40 operates in a conventional manner. The desired operating frequency band of ring oscillator 40 is determined by the number of gain stages. Increasing the number of stages decreases the operating frequency. There can be an even number or an odd number of composite gain stages. Note than in one embodiment, there may be only two composite gain stages. Various embodiments of the composite gain stages of ring oscillator 40 will be described below.

Figure 3:
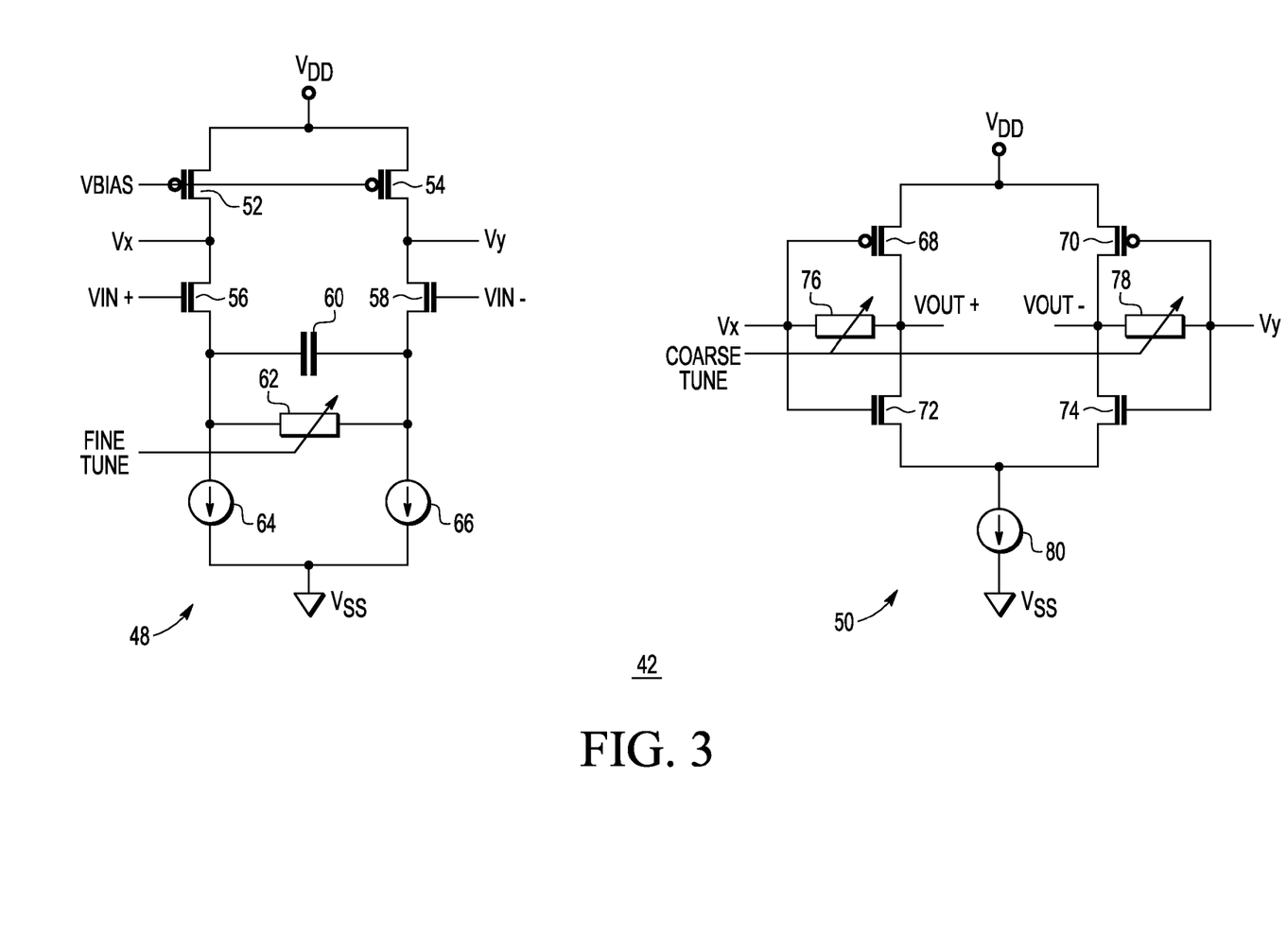
FIG. 3 illustrates, in schematic diagram form, a composite gain stage of the ring oscillator of FIG. 2 in accordance with an embodiment.

FIG. 3 illustrates, in schematic diagram form, an embodiment of composite gain stage 42 of ring oscillator 40 of FIG. 2. Composite gain stage 42 includes transconductance stage 48 and transimpedance stage 50. Transconductance stage 48 includes P-channel transistors 52 and 54, N-channel transistors 56 and 58, current sources 64 and 66, capacitor 60, and variable resistor 62. Transistors 52 and 56 and current source 64 form one current path from power supply voltage terminal VDD to power supply voltage terminal VSS. Transistors 54 and 58 and current source 66 form another current path from VDD to VSS. Transistors 56 and 58 form a source degeneration differential pair. Variable resistance 62 provides frequency fine tuning in response to control signal FINE TUNE during operation of PLL circuit 12. Variable resistance 62 determines a ratio of a peak gain at high frequency to the gain at low frequency. This gain ratio determines the delay time for a signal between stages and can tune a VCO running frequency either by enhancing the signal edge rate or extending the gain stage bandwidth. Transimpedance stage 50 includes a pair of inverters, a tail current source and two feedback variable impedances coupled between the input and output terminals.

In transconductance stage 48, P-channel transistor 52 has a source (current electrode) connected to VDD, a drain (current electrode) connected to an output terminal labeled "VX", and a gate (control electrode) for receiving a bias voltage labeled "VBIAS". P-channel transistor 54 has a source connected to VDD, a drain connected to an output terminal labeled "VY", and a gate for receiving bias voltage VBIAS. N-channel transistor 56 has a drain connected to the drain of transistor 52, a source, and a gate for receiving an input signal labeled "VIN+". N-channel transistor 58 has a drain connected to the drain of transistor 54, a source, and a gate for receiving an input signal labeled "VIN−". Current source 64 has a first terminal connected to the source of transistor 56, and a second terminal connected to power supply voltage terminal VSS. Current source 66 has a first terminal connected to the source of transistor 58, and a second terminal connected to VSS. Capacitor 60 has a first plate electrode connected to the source of transistor 56, and a second plate electrode connected to the source of transistor 58. Variable resistance 62 has a first terminal connected to the source of transistor 56, a second terminal connected to the source of transistor 58, and a control terminal for receiving control signal FINE TUNE.

In transimpedance stage 50, P-channel transistor 68 and N-channel transistor 72 form a first inverter, and P-channel transistor 70 and N-channel transistor 74 form a second inverter. P-channel transistor 68 has a source connected to power supply voltage terminal VDD, a drain connected to output terminal VOUT+, and a gate connected to input terminal VX. N-channel transistor 72 has a drain connected to the drain of P-channel transistor 68, a source, and a gate connected to the gate of P-channel transistor 68. P-channel transistor 70 has a source connected to VDD, a drain connected to output terminal VOUT−, and a gate connected to input terminal VY. N-channel transistor 74 has a drain connected to the drain of P-channel transistor 70, a source connected to the source of transistor 72, and a gate connected to the gate of P-channel transistor 70. Current source 80 has a first terminal connected to the sources of transistors 72 and 74, and a second terminal connected to VSS. Variable impedance 76 has a first terminal connected to the gates of transistors 68 and 72, a second terminal connected to the drains of transistors 68 and 72, and a control terminal for receiving control signal COARSE TUNE. Variable impedance 78 has a first terminal connected to the gates of transistors 70 and 74, a second terminal connected to the drains of transistors 70 and 74, and a control terminal for receiving control signal COARSE TUNE.

Transconductance stage 48 provides a differential current mode signal having a relatively small voltage swing. The current mode signal is provided to the input terminals of transimpedance stage 50. Transimpedance stage 50 has a relatively low input impedance compared to a conventional complementary metal oxide semiconductor (CMOS) gate impedance because of variable resistances 76 and 78. Transimpedance stage 50 provides a voltage mode signal with significant gain. Both the transconductance stage 48 and the transimpedance stage 50 have inverting 180 degree phase difference between their input and output signals. For maximum speed, only two composite gain stages are required. A total delay time for a ring oscillator comprising two composite gain stages 42 is the sum of two shorter delays contributed by the signals from the transconductance stage to the transimpedance stage, and two regular delays from the transimpedance stages to the transconductance stages. Gain can be increased, or enhanced, by increasing the resistance of feedback variable resistances 76 and 78. The delay time is determined by the ratios of the peak gain to low frequency gain.

A ring oscillator implemented with a plurality of composite gain stages 42 has a wider tuning range than a ring oscillator that uses a variable capacitor for frequency tuning. Also, the gain of the ring oscillator does not decrease with increasing frequency, as is the case of prior art ring oscillators that use a variable capacitance for frequency tuning. In addition, for a maximum frequency design, the ring oscillator only needs two composite gain stages.

Figure 4:
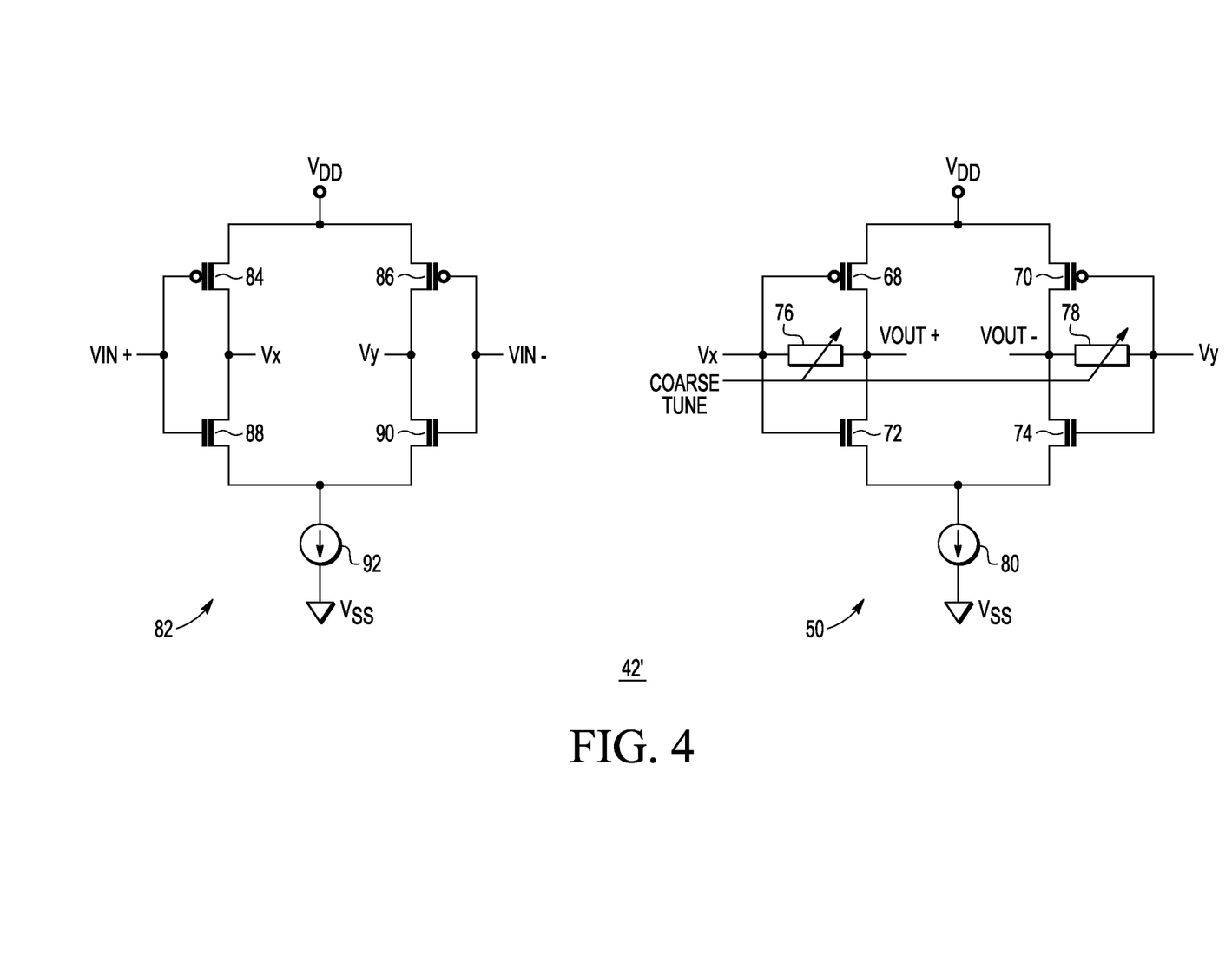
FIG. 4 illustrates, in schematic diagram form, a composite gain stage of the ring oscillator of FIG. 2 in accordance with another embodiment.

FIG. 4 illustrates, in schematic diagram form, composite gain stage 42' of ring oscillator 40 of FIG. 2 in accordance with another embodiment. Composite gain stage 42' includes transconductance stage 82 and transimpedance stage 50. Transconductance stage 82 includes a pair of inverters and a tail current source. More specifically, transconductance stage 82 includes P-channel transistors 84 and 86, N-channel transistors 88 and 90, and current source 92. P-channel transistor 84 and N-channel transistor 88 form one inverter, and P-channel transistor 86 and N-channel transistor 90 form another inverter. Transimpedance stage 50 is the same as described above regarding composite gain stage 42.

In transconductance stage 82, P-channel transistor 84 has a source connected to VDD, a drain connected to output terminal VX, and a gate connected to input terminal VIN+. N-channel transistor 88 has a drain connected to the drain of P-channel transistor 84, a source, and a gate connected to the gate of transistor 84. P-channel transistor 86 has a source connected to VDD, a drain connected to output terminal VY, and a gate connected to input terminal VIN−. N-channel transistor 90 has a drain connected to the drain of transistor 86, a source connected to the source of transistor 88, and a gate connected to the gate of transistor 86. Current source 92 has a first terminal connected to the sources of transistors 88 and 90, and a second terminal connected to VSS.

Transconductance stage 82 outputs a current mode signal instead of a voltage mode signal as seen in regular CMOS inverters because of tail current source 92. The inverters are biased with a DC current and maintained in an active condition. Note that transconductance stage 82 does not include a variable resistance and therefore does not have a fine tuning capability. However, a fine tuning capability can be provided to a VCO having transconductance stage 82 by including at least one composite gain stage that has a transconductance stage with a variable resistance. For example, a ring oscillator may have one or more composite gain stages 42' and one composite gain stage 42. The composite gain stage 42 includes a variable resistance to provide the fine tuning capability.

Figure 5:
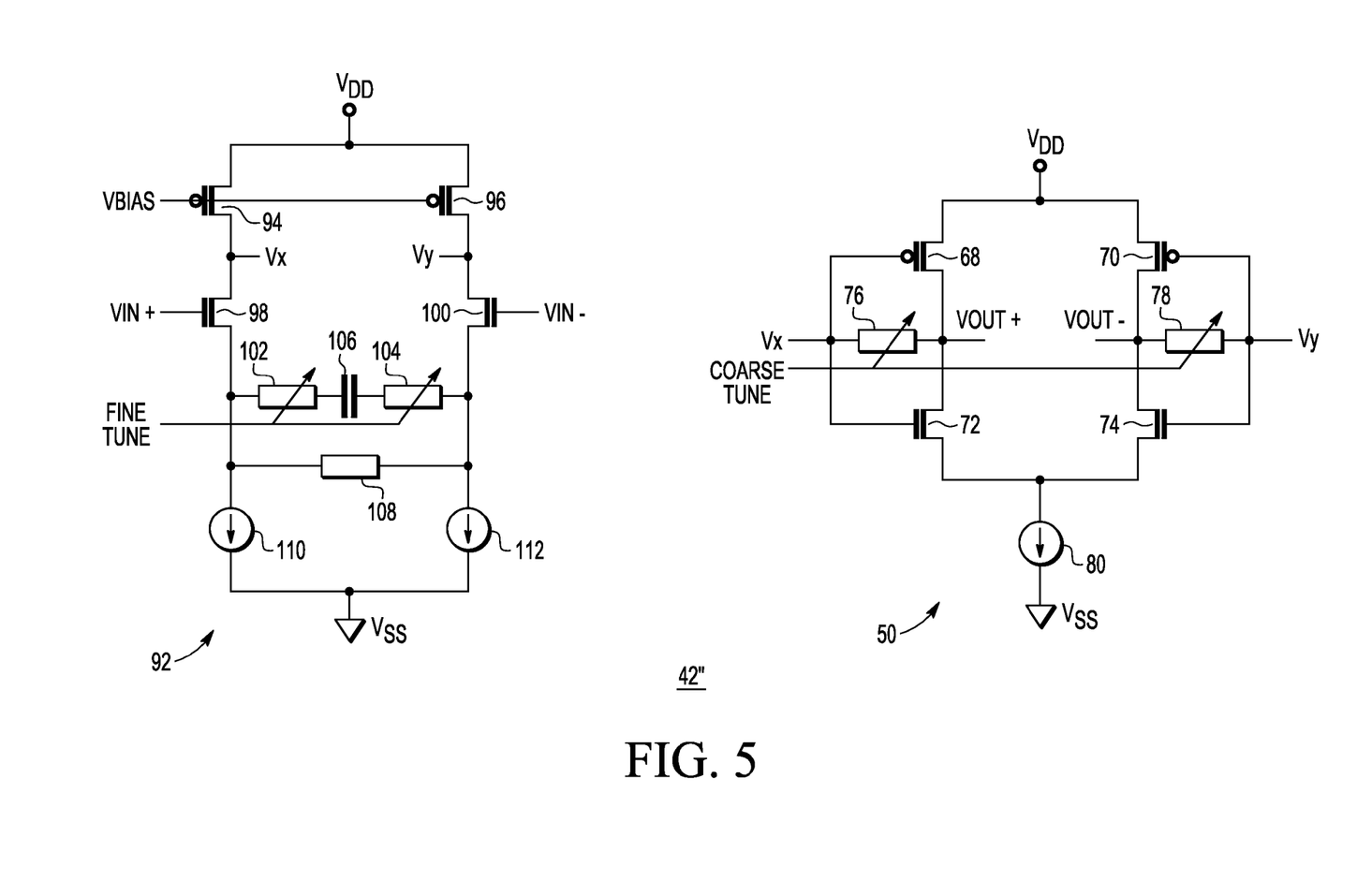
FIG. 5 illustrates, in schematic diagram form, a composite gain stage of the ring oscillator of FIG. 2 in accordance with another embodiment.

FIG. 5 illustrates, in schematic diagram form, composite gain stage 42" of ring oscillator 40 of FIG. 2 in accordance with another embodiment. Composite gain stage 42" includes transconductance stage 92 and transimpedance stage 50. Transconductance stage 92 includes P-channel transistors 94 and 96, N-channel transistors 98 and 100, current sources 110 and 112, fixed resistance 108, fixed capacitance 106, and variable resistances 102 and 104. Transimpedance stage 50 is the same as described above.

Transconductance stage 92 includes a first current path from VDD to VSS that includes transistors 94 and 98 and current source 110, and a second current path from VDD to VSS that includes transistors 96 and 100 and current source 112. P-channel transistor 94 has a source connected to VDD, a drain connected to output terminal VX, and a gate for receiving bias voltage VBIAS. P-channel transistor 96 has a source connected to VDD, a drain connected to output terminal VY, and a gate for receiving bias voltage VBIAS. N-channel transistor 98 has a drain connected to the drain of P-channel transistor 94, a source, and a gate for receiving input signal VIN+. N-channel transistor 100 has a drain connected to the drain of P-channel transistor 96, a source, and a gate for receiving input signal VIN−. Current source 110 has a first terminal connected to the source of transistor 98, and a second terminal connected to VSS. Current source 112 has a first terminal connected to the source of transistor 100, and a second terminal connected to VSS. Resistance 108 has a first terminal connected to the source of transistor 98, and a second terminal connected to the source of transistor 100. Variable resistance 102 has a first terminal connected to the source of transistor 98, a control terminal for receiving control signal FINE TUNE, and a second terminal. Capacitance 106 has a first plate electrode connected to the second terminal of variable resistance 102, and a second plate electrode. Variable resistance 104 has a first terminal connected to the second plate electrode of capacitance 106, a control terminal for receiving control signal FINE TUNE, and a second terminal connected to the source of transistor 100.

Transconductance stage 42" functions similarly to transconductance stage 42 except that variable resistances 102 and 104 are connected in series with capacitor 106 instead of in parallel. The series resistance is used to reduce, or suppress, the peak gain at the high frequency band. The frequency and gain of transconductance stage 42" will decrease with increasing resistance.

Figure 6:
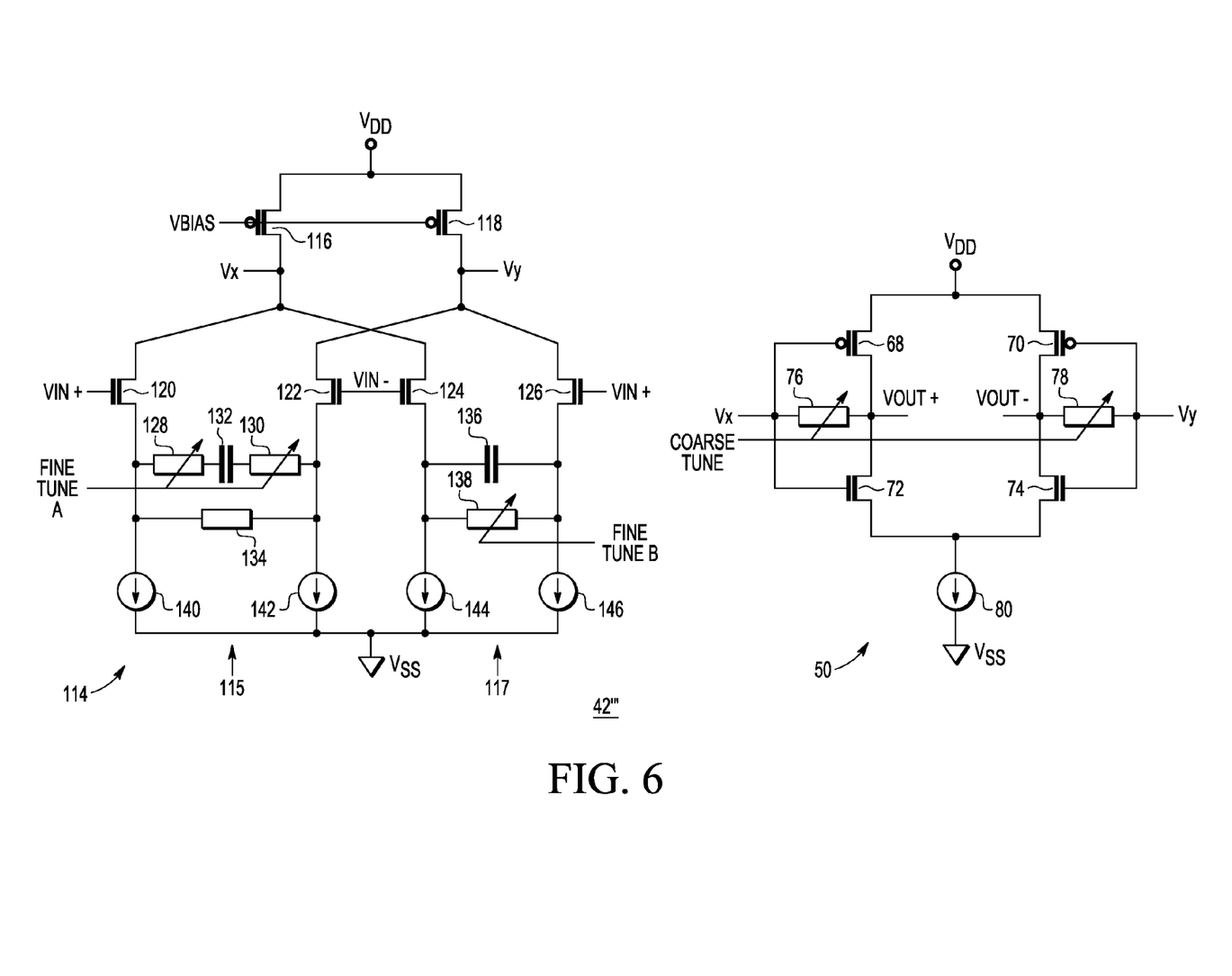
FIG. 6 illustrates, in schematic diagram form, a composite gain stage of the ring oscillator of FIG. 2 in accordance with another embodiment.

FIG. 6 illustrates, in schematic diagram form, composite gain stage 42''' of ring oscillator 40 of FIG. 2 in accordance with another embodiment. Composite gain stage 42''' includes transconductance stage 114 and transimpedance stage 50. Transimpedance stage 50 is the same as described above. Transconductance stage 114 includes portion 115 and portion 117. Portion 115 includes P-channel transistors 116 and 118, N-channel transistors 120 and 122, current sources 140 and 142, fixed resistance 134, fixed capacitance 132, and variable resistors 128 and 130. Portion 117 includes P-channel transistors 116 and 118, N-channel transistors 124 and 126, current sources 144 and 146, fixed capacitance 136, and variable resistance 138. Portion 115 functions to suppress gain similarly to composite gain stage 42" of FIG. 5, and Portion 117 functions to enhance gain similarly to composite gain stage 42 of FIG. 3. Variable resistances 128 and 130 receive a control signal labeled "FINE TUNE A" and variable resistance 138 receives a control signal labeled "FINE TUNE B". If portion 115 is used, increasing a resistance of variable resistances 128 and 130 causes gain to decrease and frequency to decrease. If portion 117 is used, increasing resistance of variable resistance 138 causes gain and frequency to increase.

Figure 7:
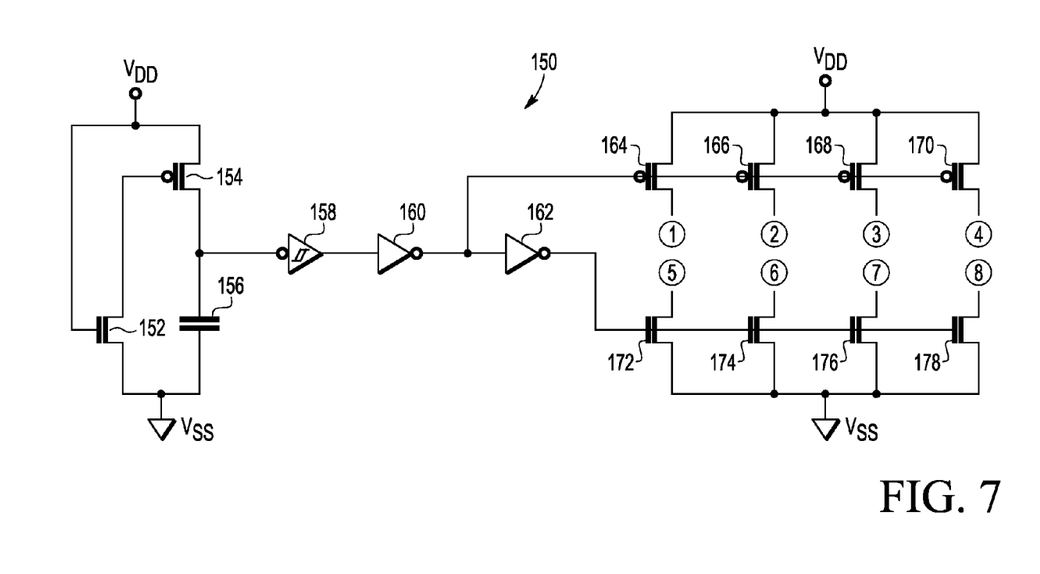
FIG. 7 illustrates, in partial schematic diagram form and partial logic diagram form, a start-up circuit for a ring oscillator having an even number of stages.

FIG. 7 illustrates, in partial schematic diagram form and partial logic diagram form, start-up circuit 150 for a ring oscillator having an even number of stages. A ring oscillator having an even number of composite gain stages may not be easily started when a supply voltage is applied. Start-up circuit 150 is used to trigger initial oscillation of the ring oscillator. Start-up circuit 150 includes P-channel transistors 154, 164, 166, 168, and 170, N-channel transistor 152, 172, 174, 176, and 178, capacitor 156, Schmitt trigger 158, and inverters 160 and 162. Start-up circuit 150 provides a pulse to various nodes in the ring oscillator in response to the power supply voltage increasing above a predetermined voltage. Start-up circuit 150 is for a ring oscillator having four stages. In other embodiments, the start-up circuit can be adapted for ring oscillators having any number of stages.

In operation, VDD is provided to start-up circuit 150 and as VDD increases N-channel transistor 152 starts to become conductive pulling the gate of P-channel transistor 154 low. P-channel transistor 154 becomes conductive, providing VDD to the input of Schmitt trigger 158. Schmitt trigger 158 provides a pulse to inverters 160 and 162, P-channel transistors 164, 166, 168, and 170 become conductive when inverter 160 outputs a logic low, and transistors 172, 174, 176, and 178 become conductive when inverter 162 outputs a logic high. Therefore, when transistors 172, 174, 176, and 178 are conductive, the drains of transistors 172, 174, 176, and 178, numbered with a circled 5, 6, 7, and 8, respectively, provide a low voltage, and the drains of transistors 164, 166, 168, 170, numbered with a circled 1, 2, 3, and 4, respectively, provide a high voltage. The transistor drains are coupled to input terminals of the various stages of the ring oscillator. An example application of start-up circuit 150 is illustrated in FIG. 8.

Figure 8:
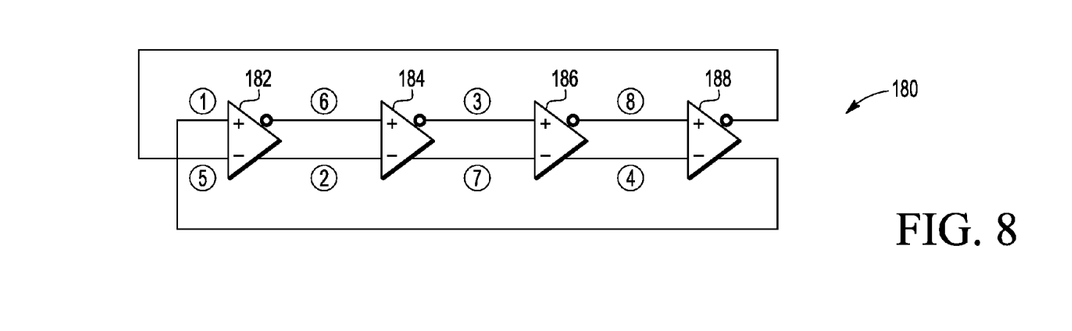
FIG. 8 illustrates, in logic diagram form, a ring oscillator having an even number of stages.

FIG. 8 illustrates, in logic diagram form, ring oscillator 180 having an even number of stages. Ring oscillator 180 has four stages 182, 184, 186, and 188. The stages can be any of composite gain stages illustrated in FIG. 3, FIG. 4, FIG. 5, and FIG. 6 in any combination. Start-up circuit 150 is connected to ring oscillator 180 by connecting the numbered transistor drains having circled numbers to the ring oscillator input terminals having corresponding circled numbers. When the ring oscillator is powered up, transistors 164, 166, 168, and 170 will provide a high pulse and transistors 172, 174, 176, and 178 will provide a low pulse causing ring oscillator 180 to begin oscillating.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A voltage controlled oscillator comprising:
  a plurality of serially connected composite gain stages, a composite gain stage of the plurality of serially connected composite gain stages comprising:
    a transconductance stage having first and second current paths from a first power supply voltage terminal to a second power supply voltage terminal, each of the first and second current paths having an input terminal and an output terminal, and a first variable resistance coupled between the first and second current paths, the first variable resistance responsive to a first, fine tune control signal that adjusts a frequency of the voltage controlled oscillator during operation of the voltage controlled oscillator, wherein the fine tune control signal is generated based on a determination of whether an output signal from the voltage controlled oscillator leads or lags a reference signal; and a transimpedance stage having a first inverter and a second inverter, the first inverter having an input terminal coupled to the output of the first current path and an output terminal, the second inverter having an input terminal coupled to the output of the second current path, and an output terminal, a second variable resistance coupled between the input terminal and the output terminal of the first inverter, a third variable resistance coupled between the input terminal and the output terminal of the second inverter, the second and third variable resistances responsive to a second, coarse tune control signal that is generated based on the first, fine tune control signal, wherein the second, coarse tune control signal adjusts a frequency range of the voltage controlled oscillator until the frequency range is in a desired range.

2. The voltage controlled oscillator of claim 1, wherein the transconductance stage further comprises:
a first transistor having a first current electrode coupled to the first power supply voltage terminal, a control electrode for receiving a bias voltage, and a second current electrode coupled to a first output terminal;
a second transistor having a first current electrode coupled to the second current electrode of the first transistor, a control electrode coupled to a first input terminal for receiving a first input signal, and a second current electrode;
a first current source having a first terminal coupled to the second current electrode of the second transistor, and a second terminal coupled to the second power supply voltage terminal;
a third transistor having a first current electrode coupled to the first power supply voltage terminal, a control electrode for receiving the bias voltage, and a second current electrode coupled to a second output terminal;
a fourth transistor having a first current electrode coupled to the second current electrode of the third transistor, a control electrode coupled to a second input terminal for receiving a second input signal, and a second current electrode; and
a second current source having a first terminal coupled to the second current electrode of the fourth transistor, and a second terminal coupled to the second power supply voltage terminal.

3. The voltage controlled oscillator of claim 2, wherein the transconductance stage further comprises:
a capacitor having a first plate electrode coupled to the second current electrode of the second transistor, and a second plate electrode coupled to the second current electrode of the fourth transistor; and
the first variable resistance having a first terminal coupled to the second current electrode of the second transistor, a second terminal coupled to the second current electrode of the fourth transistor, and a control terminal for receiving the first control signal.

4. The voltage controlled oscillator of claim 2, wherein the transconductance stage further comprises:
the first variable resistance having a first terminal coupled to the second current electrode of the second transistor, and a second terminal;
a capacitor having a first plate electrode coupled to the second terminal of the first variable resistance, and a second plate electrode; and
a fourth variable resistance having a first terminal coupled to the second plate electrode of the capacitor, and a second terminal coupled to the second current electrode of the fourth transistor.

5. The voltage controlled oscillator of claim 2, further comprising:
a fifth transistor having a first current electrode coupled to the second current electrode of the first transistor, a control electrode coupled to the second input terminal, and a second current electrode;
a third current source having a first terminal coupled to the second current electrode of the fifth transistor, and a second terminal coupled to the second power supply voltage terminal;
a sixth transistor having a first current electrode coupled to the second current electrode of the third transistor, a control electrode coupled to the first input terminal, and a second current electrode; and
a fourth current source having a first terminal coupled to the second current electrode of the sixth transistor, and a second terminal coupled to the second power supply voltage terminal.

6. The voltage controlled oscillator of claim 5, further comprising:
the first variable resistance having a first terminal coupled to the second current electrode of the second transistor, and a second terminal;
a first capacitor having a first plate electrode coupled to the second terminal of the first variable resistance, and a second plate electrode;
a fourth variable resistance having a first terminal coupled to the second plate electrode of the first capacitor, a second terminal coupled to the second current electrode of the fourth transistor, and a control electrode for receiving the first control signal; and
a resistive element having a first terminal coupled to the second current electrode of the second transistor, and a second terminal coupled to the second current electrode of the fourth transistor.

7. The voltage controlled oscillator of claim 6, further comprising:
a second capacitor having a first plate electrode coupled to the second current electrode of the fifth transistor, and a second plate electrode coupled to the second current electrode of the sixth transistor; and
a fifth variable resistance having a first terminal coupled to the second current electrode of the fifth transistor, a second terminal coupled to the second current electrode of the sixth transistor, and a control electrode for receiving a third control signal.

8. The voltage controlled oscillator of claim 1, wherein the transimpedance stage further comprises a current source coupled between the first and second inverters and the second power supply voltage terminal.

9. The voltage controlled oscillator of claim 1, wherein the plurality of serially connected composite gain stages comprises an even number of serially connected composite gain stages.

10. The voltage controlled oscillator of claim 9, further comprising a start-up circuit comprising:
a first transistor having a first current electrode coupled to the first power supply voltage terminal, a control electrode, and a second current electrode;
a second transistor having a first current electrode coupled to the control electrode of the first transistor, a control electrode coupled to the first power supply voltage terminal, and a second current electrode coupled to the second power supply voltage terminal;

a capacitor having a first plate electrode coupled to the second current electrode of the first transistor, and a second plate electrode coupled to the second power supply voltage terminal;

a Schmitt trigger having an input terminal coupled to the second current electrode of the first transistor, and an output terminal; and a plurality of start-up switches coupled to the output terminal of the Schmitt trigger and to selected input terminals and output terminals of the plurality of serially connected composite gain stages.

11. A voltage controlled oscillator comprising:

a plurality of serially connected composite gain stages, a composite gain stage of the plurality of serially connected composite gain stages comprising:

a transconductance stage comprising:

a first transistor having a first current electrode coupled to the first power supply voltage terminal, a control electrode for receiving a bias voltage, and a second current electrode coupled to a first output terminal;

a second transistor having a first current electrode coupled to the second current electrode of the first transistor, a control electrode coupled to a first input terminal for receiving a first input signal, and a second current electrode;

a first current source having a first terminal coupled to the second current electrode of the second transistor, and a second terminal coupled to the second power supply voltage terminal;

a third transistor having a first current electrode coupled to the first power supply voltage terminal, a control electrode for receiving the bias voltage, and a second current electrode coupled to a second output terminal;

a fourth transistor having a first current electrode coupled to the second current electrode of the third transistor, a control electrode coupled to a second input terminal for receiving a second input signal, and a second current electrode;

a second current source having a first terminal coupled to the second current electrode of the fourth transistor, and a second terminal coupled to the second power supply voltage terminal; and a first variable resistance having a first terminal coupled to the second current electrode of the second transistor, a second terminal coupled to the second current electrode of the fourth transistor, and a control terminal for receiving a first, fine tune control signal, wherein the first variable resistance is responsive to the first control signal to adjust a frequency of the voltage controlled oscillator during operation of the voltage controlled oscillator, and wherein the fine tune control signal is generated based on a determination of whether an output signal from the voltage controlled oscillator leads or lags a reference signal; and a transimpedance stage having a first inverter and a second inverter, the first inverter having an input terminal coupled to the first output terminal of the transconductance stage, the second inverter having an input terminal coupled to the second output terminal of the transconductance stage, and an output terminal, a second variable resistance coupled between the input terminal and the output terminal of the first inverter, a third variable resistance coupled between the input terminal and the output terminal of the second inverter, the second and third variable resistances responsive to a second, coarse tune control signal that is generated based on the first, fine tune control signal, wherein the second, coarse tune control signal adjusts a frequency range of the voltage controlled oscillator until the frequency range is in a desired range.

12. The voltage controlled oscillator of claim 11, wherein the transconductance stage further comprises a capacitor having a first plate electrode coupled to the second current electrode of the second transistor, and a second plate electrode coupled to the second current electrode of the fourth transistor.

13. The voltage controlled oscillator of claim 11, wherein the transconductance stage further comprises:

the first variable resistance having a first terminal connected to the second current electrode of the second transistor, and a second terminal;

a capacitor having a first plate electrode connected to the second terminal of the first variable resistance, and a second plate electrode; and a fourth variable resistance having a first terminal connected to the second plate electrode of the capacitor, and a second terminal connected to the second current electrode of the fourth transistor.

14. The voltage controlled oscillator of claim 11, further comprising:

a fifth transistor having a first current electrode coupled to the second current electrode of the first transistor, a control electrode coupled to the second input terminal, and a second current electrode;

a third current source having a first terminal coupled to the second current electrode of the fifth transistor, and a second terminal coupled to the second power supply voltage terminal;

a sixth transistor having a first current electrode coupled to the second current electrode of the third transistor, a control electrode coupled to the first input terminal, and a second current electrode; and a fourth current source having a first terminal coupled to the second current electrode of the sixth transistor, and a second terminal coupled to the second power supply voltage terminal.

15. The voltage controlled oscillator of claim 11, wherein the transimpedance stage further comprises a current source coupled between the first and second inverters and the second power supply voltage terminal.

16. The voltage controlled oscillator of claim 11, wherein the plurality of serially connected composite gain stages comprises an even number of serially connected composite gain stages.

17. The voltage controlled oscillator of claim 16, further comprising a start-up circuit comprising:

a fifth transistor having a first current electrode coupled to the first power supply voltage terminal, a control electrode, and a second current electrode;

a sixth transistor having a first current electrode coupled to the control electrode of the first transistor, a control electrode coupled to the first power supply voltage terminal, and a second current electrode coupled to the second power supply voltage terminal;

a capacitor having a first plate electrode coupled to the second current electrode of the fifth transistor, and a second plate electrode coupled to the second power supply voltage terminal;

a Schmitt trigger having an input terminal coupled to the second current electrode of the fifth transistor, and an output terminal; and a plurality of start-up switches coupled to the output terminal of the Schmitt trigger and to selected input terminals and output terminals of the plurality of serially connected composite gain stages.

18. A voltage controlled oscillator comprising:

a plurality of serially connected composite gain stages, a composite gain stage of the plurality of serially connected composite gain stages comprising:

a transconductance stage comprising:
- a first transistor having a first current electrode coupled to the first power supply voltage terminal, a control electrode for receiving a bias voltage, and a second current electrode coupled to a first output terminal;
- a second transistor having a first current electrode coupled to the second current electrode of the first transistor, a control electrode coupled to a first input terminal for receiving a first input signal, and a second current electrode;
- a first current source having a first terminal coupled to the second current electrode of the second transistor, and a second terminal coupled to the second power supply voltage terminal;
- a third transistor having a first current electrode coupled to the first power supply voltage terminal, a control electrode for receiving the bias voltage, and a second current electrode coupled to a second output terminal;
- a fourth transistor having a first current electrode coupled to the second current electrode of the third transistor, a control electrode coupled to a second input terminal for receiving a second input signal, and a second current electrode;
- a second current source having a first terminal coupled to the second current electrode of the fourth transistor, and a second terminal coupled to the second power supply voltage terminal; and
- a first variable resistance having a first terminal coupled to the second current electrode of the second transistor, a second terminal coupled to the second current electrode of the fourth transistor, and a control terminal for receiving a first, fine tune control signal that adjusts a frequency of the voltage controlled oscillator during operation of the voltage controlled oscillator, wherein the fine tune control signal is generated based on a determination of whether an output signal from the voltage controlled oscillator leads or lags a reference signal; and a transimpedance stage comprising:
- a fifth transistor having a first current electrode coupled to the first power supply voltage terminal, a control electrode coupled to the first output terminal of the transconductance stage, and a second current electrode;
- a sixth transistor having a first current electrode coupled to the second current electrode of the fifth transistor, a control electrode coupled to the first output terminal of the transconductance stage, and a second current electrode;
- a second variable resistance having a first terminal coupled to the control electrodes of the fifth and sixth transistors, a second terminal coupled to the second current electrode of the fifth transistor, and a control electrode for receiving a second, coarse tune control signal that is generated based on the first, fine tune control signal, wherein the second, coarse tune control signal adjusts a frequency range of the voltage controlled oscillator until the frequency range is in a desired range;
- a seventh transistor having a first current electrode coupled to the first power supply voltage terminal, a control electrode coupled to the second output terminal of the transconductance stage, and a second current electrode;
- an eighth transistor having a first current electrode coupled to the second current electrode of the seventh transistor, a control electrode coupled to the second output terminal of the transconductance stage, and a second current electrode;
- a third variable resistance having a first terminal coupled to the control electrodes of the seventh and eighth transistors, a second terminal coupled to the second current electrode of the seventh transistor, and a control electrode for receiving the second control signal; and
- a third current source having a first terminal coupled to the second current electrodes of the sixth and eighth transistors, and a second terminal coupled to the second power supply voltage terminal.

19. The voltage controlled oscillator of claim 18, wherein the transconductance stage further comprises a capacitor having a first plate electrode coupled to the second current electrode of the second transistor, and a second plate electrode coupled to the second current electrode of the fourth transistor.

20. The voltage controlled oscillator of claim 18, wherein the transconductance stage further comprises:
- the first variable resistance having a first terminal connected to the second current electrode of the second transistor, and a second terminal;
- a capacitor having a first plate electrode connected to the second terminal of the first variable resistance, and a second plate electrode; and
- a fourth variable resistance having a first terminal connected to the second plate electrode of the capacitor, and a second terminal connected to the second current electrode of the fourth transistor.

* * * * *